(12) United States Patent
Ibok et al.

(10) Patent No.: US 6,229,198 B1  
(45) Date of Patent: May 8, 2001

(54) NON-UNIFORM GATE DOPING FOR REDUCED OVERLAP CAPACITANCE

(75) Inventors: Effiong Ibok, Sunnyvale; Carl Huster, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/357,332

(22) Filed: Jul. 20, 1999

(51) Int. Cl.[7] .................................................. H01L 29/72
(52) U.S. Cl. .......................... 257/655; 257/607; 257/412
(58) Field of Search .................................... 257/412, 655, 257/611, 607

(56) References Cited

U.S. PATENT DOCUMENTS

| | | | |
|---|---|---|---|
| 5,635,749 | * 6/1997 | Hong | 257/412 |
| 5,804,496 | 9/1998 | Duane | 438/520 |

* cited by examiner

*Primary Examiner*—Edward Wojciechowicz

(57) ABSTRACT

A transistor is formed comprising a gate electrode with a non-uniform impurity profile increasing from the drain side to the source side, thereby reducing the overlap capacitance between the gate electrode and drain region. In addition, the transverse electrical field in the channel region is maintained by evenly disposing gate impurity atoms throughout the entire gate electrode.

20 Claims, 3 Drawing Sheets

US 6,229,198 B1

NON-UNIFORM GATE DOPING FOR REDUCED OVERLAP CAPACITANCE

FIELD OF THE INVENTION

The present invention relates to a semiconductor device comprising transistors and a method for manufacturing the device. The present invention has particular applicability in manufacturing metal oxide semiconductor field effect transistors (MOSFETs) with submicron dimensions.

BACKGROUND ART

Over the last few decades, the electronics industry has undergone a revolution in fabricating miniaturized and highly integrated semiconductor devices. The most common semiconductor device is a metal oxide semiconductor (MOS) transistor.

The principal elements of a typical MOS semiconductor generally comprise a semiconductor substrate on which a gate electrode is disposed. The gate electrode is typically a heavily doped conductor having uniform conductivity. An input signal is typically applied to the gate electrode via a gate terminal. Heavily doped source/drain regions are formed in the semiconductor substrate and are connected to source/drain terminals. The typical MOS transistor is symmetrical, in that the source and drain regions are interchangeable. Whether a region acts as a source or drain depends on the respective applied voltages and the type of device, e.g., PMOS or NMOS. A channel region is formed in the semiconductor substrate beneath the gate electrode and separates the source/drain regions. The gate electrode is generally separated from the semiconductor substrate by an insulating layer, e.g., an oxide layer, to prevent current from flowing between the gate electrode and the source/drain regions or channel regions.

In operation, an output voltage is typically developed between the source and drain terminals. When an input voltage is applied to the gate electrode, a transverse electrical field is set up in the channel region. By varying the transverse electric field between the source and drain regions, it is possible to modulate the conductance of the channel region between the source and drain regions. In this manner, an electric field controls the current flow through the channel region. This type of devices is commonly referred to as a MOSFET.

In MOSFET devices, the voltage potentials of an operative transistor create a number of capacitance loads which adversely affect transistor performance. Among the capacitance loads developed in a MOSFET, an overlap capacitance is normally observed between the gate electrode and an adjacent drain region. The overlap capacitance is a function of the extent of overlap between the gate electrode and the underlying drain region as well as the thickness of the gate oxide layer. The overlap capacitance contributes to noise and tends to reduce the switching speed of the transistor, both of which are undesirable from a performance standpoint.

Various approaches have been proposed to reduce the vertical electric field effect and overlap capacitance. According to the method disclosed in U.S. Pat. No. 5,804,496 issued to Michael Duane, a gate electrode is formed by multiple ion implantation steps to reduce the conductivity of both edge portions or to dope the edge portions with a different conductivity than the central portion of the gate electrode. As shown in FIG. 1, an oxide layer 12 is formed on a substrate 10, and a gate electrode 14 is formed on a oxide layer 12. As shown in FIG. 2, ion implantation is then conducted, as indicated by arrow A, to form shallow source/drain extension 20 extending under the gate electrode 14 at a predetermined distance, which is a primary factor in the overlap capacitance of conventional semiconductors. As shown in FIG. 3, an edge dopant is implanted into the first edge portion 30 of the gate electrode 14 at a predetermined angle, as shown by arrow B. Subsequently, the second edge portion 40 is also ion implanted with the edge dopant at the predetermined angle, as shown by arrow C in FIG. 4. A spacer layer 50 is then formed on the surface of the substrate 10 including gate electrode 14, as shown in FIG. 5. Sidewall spacers 60 are then formed on the side surfaces of gate electrode 14, as shown in FIG. 6. Then, a gate dopant is ion implanted as shown by arrows D in FIG. 7, into gate electrode 14 including edge portions 30 and 40, and to form source/drain regions 70. The edge portions 30 and 40 of the gate electrode 14 contain the edge dopant which either inhibits diffusion of the gate dopant or has a different conductive type than the gate dopant. Therefore, gate dopant implantation, the edge portions 30 and 40 have reduced conductivity. Advancing to FIG. 14, the edge dopant profile of Duane's gate electrode is shown by curve N, and an actual gate impurity profile after the gate dopant implantation is shown by curve B. The gate dopant concentration level at the edge portions $G_D$–$D_G$ and $S_G$–$G_S$ is lower than the central portion $D_G$–$S_G$ of Duane's gate electrode, thereby reducing the overlap capacitance formed between the edge portions 30, 40 and the source and drain regions 70. It is known that such overlap capacitance degrades the device speed, but the overlap capacitance formed between the gate electrode and source region dose not adversely impact device speed. In addition, as shown in FIG. 14, the significantly reduced amount of the gate dopant at both side portions of the gate electrode weakens the transverse electrical field in the channel region.

Accordingly, there exists a need for a semiconductor device exhibiting reduced overlap capacitance, and an efficient and production worthy method for manufacturing such a semiconductor device.

DISCLOSURE OF THE INVENTION

An advantage of the present invention is simplified and production worthy methodology for manufacturing a MOSFET exhibiting reduced overlap capacitance.

Another advantage of the present invention is a semiconductor device exhibiting reduced overlap capacitance.

Additional advantages and other features of the present invention will be set forth in part in the description which follows and in part will become apparent to those having ordinary skill in the art upon examination of the following or may be learned from the practice of the present invention. The objects and advantages of the present invention may be realized and obtained as particularly pointed out in the appended claims.

According to the present invention, the foregoing and other advantages are achieved in part by a method of manufacturing semiconductor device, the method comprising: forming a dielectric layer on a main surface of a semiconductor substrate; forming a conductive layer on the dielectric layer, having first and second side portions; and ion implanting impurity atoms into the conductive layer to form an impurity concentration profile increasing from the first side portion to the second side portion.

Another aspect of the present invention is a semiconductor comprising: a substrate; source/drain regions in the substrate with a channel region therebetween; a gate dielectric layer on the substrate overlying the channel region; and a gate electrode on the gate dielectric layer, the gate electrode having a graded impurity concentration profile laterally increasing from a first side portion to a second side portion of the gate electrode.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not restrictive.

DESCRIPTION OF THE INVENTION

The present invention enables the manufacture of a semiconductor device exhibiting reduced overlap capacitance by forming a non-uniform gate impurity profile increasing from the drain side portion to the source side portion of the gate electrode. The light doped drain side portion reduces the overlap capacitance formed between the drain side portion of the gate electrode and its underlying drain region, thereby improving device speed. In addition, the implanted gate dopant atoms are evenly distributed through out the entire gate electrode with an exception of the drain side portion, thereby substantially maintaining the transverse electrical field in the channel region.

Figure 1:
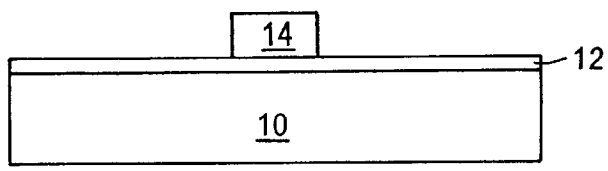
FIG. 1 to FIG. 7 illustrate sequential phases of a prior art method, similar features being denoted by similar reference numerals.
Figure 2:
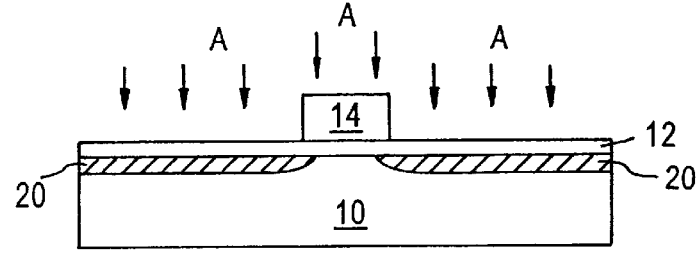
Figure 3:
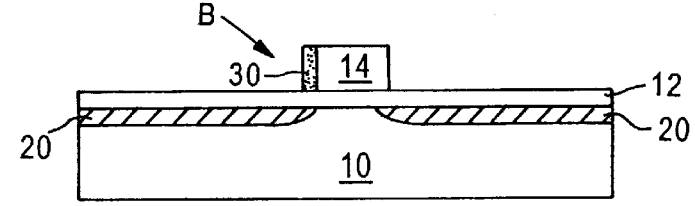
Figure 4:
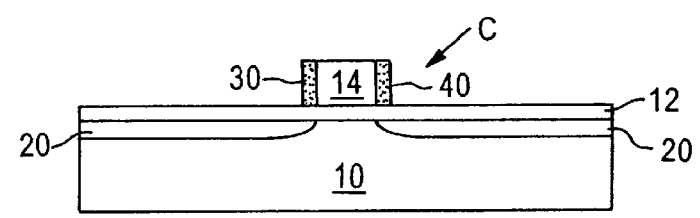
Figure 5:
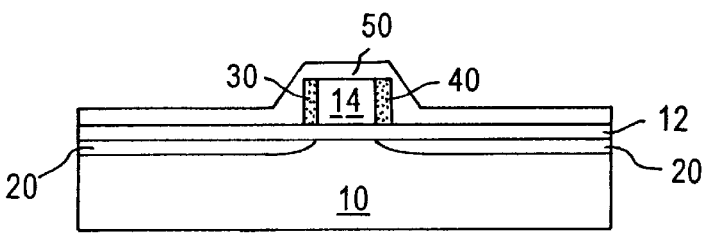
Figure 6:
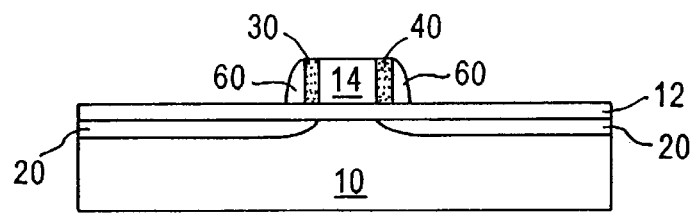
Figure 7:
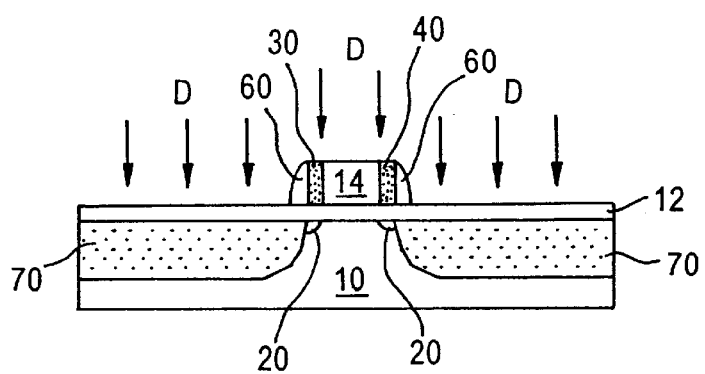
Figure 8:
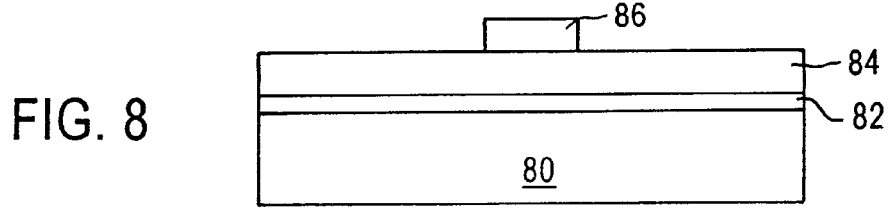
FIG. 8 to FIG. 13 illustrate sequential phases of a method according to an embodiment of the present invention, similar features being denoted by similar reference numerals.
Figure 9:
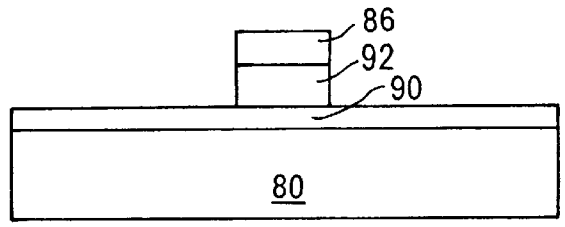

In accordance with an embodiment of the present invention, as shown in FIG. 8, a dielectric layer 82, e.g., an oxide layer, and conductive layer 84, e.g., a doped polycrystalline silicon layer, are formed on the main surface of a semiconductor substrate, epitaxial semiconductor layer, or well region 80. A photoresist (PR) layer is formed on the conductive layer 84 and patterned by conventional photolithography techniques to form PR mark 86. Conductive layer 84 and dielectric layer 82 are then etched in a conventional manner to form gate dielectric layer 90 and gate electrode 92, as shown in FIG. 9.

Figure 10:
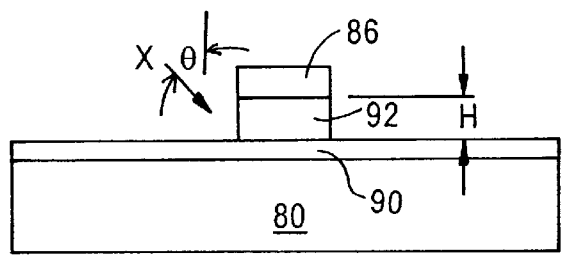

Subsequently, neutral atoms, e.g., nitrogen, oxygen, or argon are ion implanted, as shown by arrow X in FIG. 10, into the first side portion 92a of gate electrode 92 to form a neutral atom concentration profile decreasing from the first side portion 92a to second side portion 92b. The neutral atoms are ion implanted at a sufficient angle such that penetration of the neutral atoms is substantially confined to the side portion without substantial penetration of the neutral atoms into gate electrode 92. In an embodiment of the present invention, the neutral atoms are ion implanted at an angle θ of about 30° to about 70° with respect to a plane perpendicular to the main surface of the substrate 80, for a gate electrode 92 having a height of about 1000 Å° to about 2500 Å°. During ion implantation of the neutral atoms, PR mask 86 remains on the gate electrode 92, thereby facilitating confinement of the neutral atoms to first side portion 92a. In an embodiment of the present invention, the neutral atoms are ion implanted at an implantation dosage of about $1 \times 10^{14}$ atoms $cm^{-2}$ to about $1 \times 10^{15}$ atoms $cm^{-2}$ and at an implantation energy of about 5 KeV to about 60 KeV.

Figure 15:
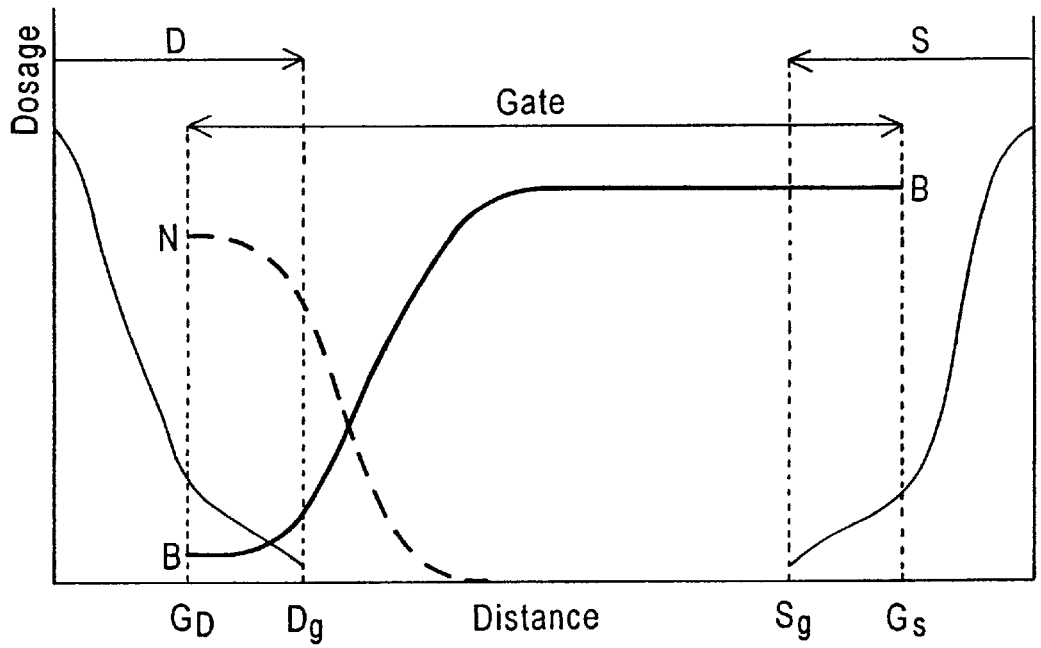
FIG. 15 illustrates a gate doping profile according to an embodiment of the present invention.

After ion implanting the neutral impurities, gate electrode 92 is annealed to repair lattice damage caused by the neutral atoms ion implantation. The annealing conditions are controlled to prevent the implanted neutral atoms from substantial diffusion into the gate electrode 92, but sufficient to crystallize the amorphization of the gate portion due to neutral ion implantation. In an embodiment of the present invention, such annealing is conducted at a temperature of about 750° C. to about 1050° C. for about 5 seconds to about 120 seconds in a rapid thermal annealing chamber, or for about 1 minute to about thirty minutes in an atmospheric furnace. Upon annealing, as shown in FIG. 15, the neutral atom concentration profile, illustrated by dotted curve N. decreases from first side portion 92a toward second side portion 92b of gate electrode 92.

Figure 11:
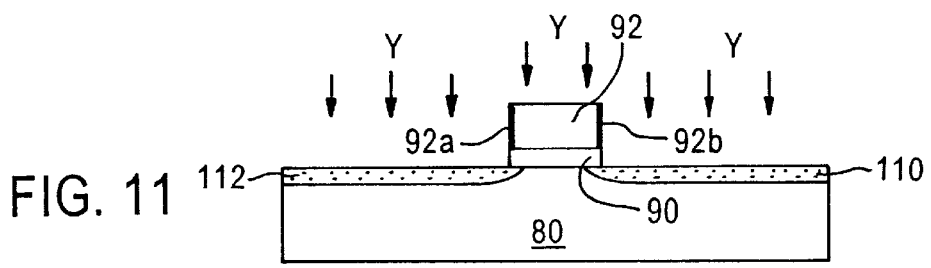
Figure 12:
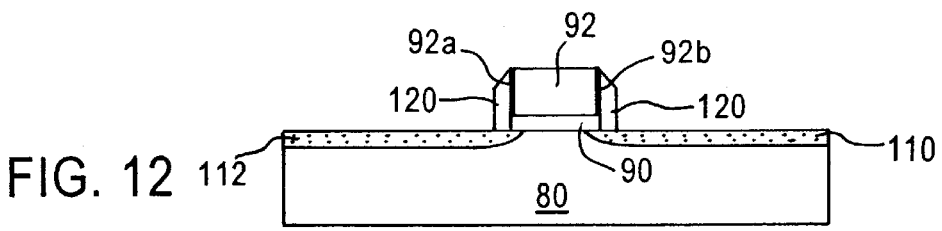

After removing PR mask 86 from gate electrode 92, impurity atoms, e.g., N type impurity atoms for a NMOS device, are then ion implanted, as shown in FIG. 11, into the surface of substrate 80 to form shallow source and drain extensions 110, 112, using PR mark 86 and gate 92 as a mask. After removing the PR mark 86, dielectric sidewall spacers 120 are formed, as shown in FIG. 12, on the side surfaces of the gate electrode 92 and gate dielectric layer 90, by conventional deposition and anisotropic etching techniques.

Figure 13:
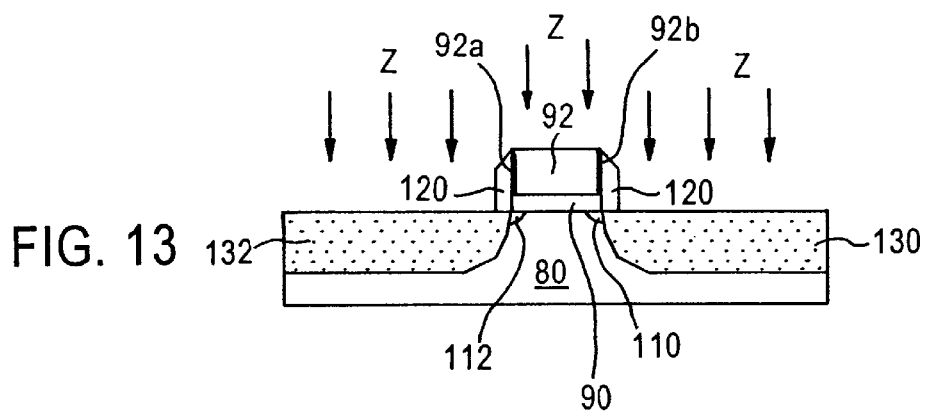
Figure 14:
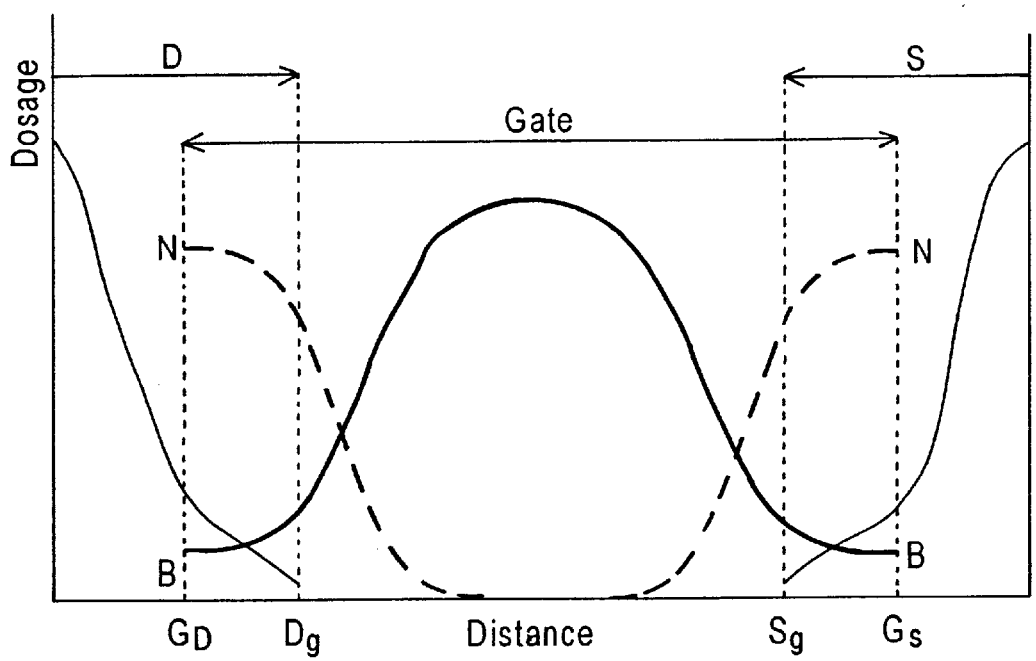
FIG. 14 illustrates a gate doping profile in accordance with a prior art method.

Subsequently, gate impurity atoms, e.g., boron, arsenic, phosphorous, indium or antimony, are ion implanted, as shown in FIG. 13, into the gate electrode 92, as shown by arrows Z, to dope gate electrode 92. In an embodiment of the present invention, the gate impurity atoms are ion implanted at an implantation dosage of about $1 \times 10^3$ atoms $cm^{-2}$ to about $1 \times 10^{16}$ atoms $cm^{-2}$ and at an implantation energy of about 2 KeV to about 60 KeV. The neutral atoms preoccupying the first side portion 92a of the gate electrode 92 inhibit the diffusion of the gate dopant and effectively reduce the conductivity of the first side portion 92a of the gate electrode 92. Source and drain regions 130, 132, respectively, can be formed by simultaneously ion implanting the gate impurity atoms, as shown by arrows Z, into the surface of the substrate 80 overlapping the shallow source and drain extensions 110, 112. The gate impurity concentration according to an embodiment of the present invention is shown by curve B in FIG. 14. As illustrated, the first side portion $G_D$–$D_G$ of the gate electrode 92 has a gate dopant concentration level of about $5\times10^{18}$ atoms cm$^{-3}$ to about $5\times10^{19}$ atoms cm$^{-3}$, and the second side portion $S_G$–$G_S$ of the gate electrode 92 has a gate dopant concentration level of about $5\times10^{19}$ atoms cm$^{-3}$ to about $1\times10^{20}$ atoms cm$^{-3}$. The lightly doped first side portion reduces the overlap capacitance between the first side portion of the gate electrode and the underlying drain region. Furthermore, the gate dopant is evenly disposed throughout the entire gate electrode 92 except for the lightly doped side portion, thereby substantially maintaining the transverse electrical field in the channel region.

An embodiment of the present invention is schematically illustrated in FIG. 13 and comprises gate electrode 92, e.g. polycrystalline silicon, having a non-uniform impurity concentration profile which laterally increases from the first side portion 92a to the second side portion 92b. Gate dielectric layer 90, e.g., an oxide layer, is formed between the gate electrode 92 and the main surface of the semiconductor substrate 80 overlying the channel region formed between source and drain regions 130, 132, respectively. Shallow source and drain extensions 110, 112 extend from the source and drain regions 130, 132 toward the channel region. Dielectric sidewall spacers 120 are formed on the side surfaces of the gate electrode 92 and gate dielectric 90. The substantially lower gate impurity concentration at the first side portion 92a of the gate electrode 92 reduces the overlap capacitance between the gate electrode 92 and its underlying drain region 132. Furthermore, the gate impurity atoms are evenly disposed throughout the entire gate electrode 92 with an exception of the first side portion 92a, thereby sufficiently maintaining the transverse electrical field in the channel region.

The present invention enjoys industrial applicability in various type of semiconductor device, particularly in semiconductor devices designed for high-speed performance. Therefore, the present invention is applicable to any CMOS technology.

Embodiments of the present invention involve the use of conventional materials and methodologies to form various components of a transistor and semiconductor device. For example, the semiconductor substrate employed in the embodiments of the present invention typically comprises monocrystalline silicon. In the previous description, numerous specific details are set forth such as specific material, structure, chemicals, process, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and a few examples of its versatility are shown and described in the present disclosure. It is to be understood that the present invention is capable of use in various other combinations and environments and is capable of changes or modifications within the scope of the inventive concept as expresses herein.

What is claimed is:

1. A method for manufacturing a semiconductor device, the method comprising:

forming a dielectric layer on a main surface of a semiconductor substrate;

forming a conductive layer on the dielectric layer, having first and second side portions; and ion implanting neutral atoms and impurity atoms into the conductive layer to form a first conductive type impurity concentration profile increasing from the first side portion to the second side portion.

2. The method according to claim 1, comprising sequentially:

ion implanting the neutral atoms and impurity atoms into the conductive layer to form a neutral atom concentration profile decreasing from the first side portion to the second side portion; and ion implanting the impurity atoms into the conductive layer to form the first conductive type impurity concentration profile increasing from the first side portion to the second side portion.

3. The method according to claim 2, comprising ion implanting nitrogen, oxygen, or argon as the neutral atoms.

4. The method according to claim 3, comprising ion implanting the neutral atoms at an angle of about 30° to about 70° with respect to a plain substantially perpendicular to the main surface.

5. The method according to claim 4, comprising ion implanting nitrogen, oxygen, or argon as the neutral atoms at an implantation dosage of about $1\times10^{14}$ atoms cm$^{-2}$ to about $1\times10^{15}$ atoms cm$^{-2}$ and at an implantation energy of about 5 KeV to about 60 KeV.

6. The method according to claim 2, further comprising annealing the conductive layer to repair lattice damage without causing any substantial diffusion of the implanted neutral atoms toward the second side portion.

7. The method according to claim 6, comprising annealing the conductive layer at a temperature of about 750° C. to 1050° C. for about 5 seconds to 120 seconds.

8. The method according to claim 2, comprising ion implanting boron, arsenic, phosphorous, indium or antimony as the impurity atoms.

9. The method according to claim 8, comprising ion implanting boron, arsenic, phosphorous, indium or antimony at an implantation dosage of about $1\times10^{13}$ atoms cm$^{-2}$ to about $1\times10^{16}$ atoms cm$^{-2}$ and at an implantation energy of about 2 KeV to about 60 KeV.

10. The method according to claim 9, wherein the second side portion of the conductive layer has an impurity concentration of about $0.5\times10^{19}$ atoms cm$^{-3}$ to about $1\times10^{20}$ atoms cm$^{-3}$.

11. The method to claim 10, wherein the first side portion of the conductive layer has an impurity concentration of about $5\times10^{18}$ atoms cm$^{-3}$ to about $5\times10^{19}$ atoms cm$^{-3}$.

12. The method according to claim 4, comprising:

forming the dielectric layer on the main surface of the substrate;

forming the conductive layer on the dielectric layer;

forming and patterning a first mask layer on the conductive layer;

ion implanting the neutral atoms into the first side portion to form the neutral atom concentration, decreasing from the first side portion to the second side portion; and subsequently ion implanting the impurity atoms in a direction substantially perpendicular to the conductive layer to form the impurity concentration profile.

13. The method according to claim 12, further comprising:

etching the conductive layer and dielectric layer to form a gate electrode and gate dielectric layer on the substrate; and ion implanting impurities onto the main surface of the substrate to form source/drain regions.

14. The method according to claim 13, further comprising:

ion implanting impurities, using the conductive layer and dielectric layer as a mask, to form shallow source/drain extensions;

forming sidewall spacers on side surfaces of the conductive layer and dielectric layer; and ion implanting atoms, using the conductive layer, dielectric layer and sidewall spacers as a mask, to form the source/drain regions.

15. The method according to claim 14, wherein the first side portion of conductive layer is proximate the shallow drain extension and drain region to reduce overlap capacitance between the conductive layer and drain region.

16. A semiconductor device comprising:

a substrate;

source/drain regions in the substrate with a channel region therebetween;

a gate dielectric layer on the substrate overlying the channel region; and a gate electrode on the gate dielectric layer, the gate electrode having a graded first conductive type impurity concentration profile laterally increasing from a first side portion to a second side portion of the gate electrode, and a graded neutral atoms concentration impurity profile decreasing from the first side portion to the second side portion of the gate electrode.

17. The semiconductor device according to claim 16, further comprising:

shallow source/drain extensions formed in the substrate, extending from the source/drain regions toward the channel region; and sidewall spacers formed on side surfaces of the gate electrode an d gate dielectric layer.

18. The semiconductor device according to claim 16, wherein the first side portion of the gate electrode has an impurity concentration of about $5 \times 10^{18}$ atoms cm$^{-3}$ to about $5 \times 10^{19}$ atoms cm$^{-3}$.

19. The semiconductor device according to claim 16, wherein the second side portion of the gate electrode has an impurity concentration of about $0.5 \times 10^{19}$ atoms cm$^{-3}$ to about $1 \times 10^{20}$ atoms cm$^{-3}$.

20. The semiconductor device according to claim 16, wherein the drain region is proximate the first side portion of the gate electrode.

* * * * *